United States Patent [19]

Young

[11] 4,405,658
[45] Sep. 20, 1983

[54] METHOD OF PRODUCING POSITIVE SLOPE STEP CHANGES ON VACUUM DEPOSITED LAYERS

[75] Inventor: Peter L. Young, North Wales, Pa.

[73] Assignee: Sperry Corporation, New York, N.Y.

[21] Appl. No.: 362,577

[22] Filed: Mar. 26, 1982

[51] Int. Cl.³ .............................................. B05D 5/12
[52] U.S. Cl. ....................................... 427/63; 427/99; 427/250; 427/255.1
[58] Field of Search .................. 427/63, 99, 250, 255.1

[56] References Cited

U.S. PATENT DOCUMENTS

| | | | |
|---|---|---|---|
| 4,129,167 | 12/1978 | Sigsbee | 427/62 |
| 4,224,361 | 9/1980 | Romankiw | 427/99 |
| 4,256,816 | 3/1981 | Dunkelberger | 427/282 |
| 4,353,935 | 10/1982 | Symersky | 427/91 |

OTHER PUBLICATIONS

Colligon, Vacuum, 11, 272 (1961).
Powell et al., *Vapor Deposition,* John Wiley & Sons, Inc. N.Y., ©1966, pp. 233–236.
Vossen et al., *Thin Film Processes,* Academic Press N.Y., ©1978 p. 12.
Berry et al., *Thin Film Technology* R. E. Krieges Publishing Co., N.Y., ©1968, pp. 8–9.

*Primary Examiner*—Norman Morgenstern
*Assistant Examiner*—Richard Buekes
*Attorney, Agent, or Firm*—John B. Sowell; Thomas J. Scott; Marshall M. Truex

[57] ABSTRACT

During the process of vacuum deposition, metals and materials are evaporated at a point source so as to create a vapor which is dispersed isotropically. Layers of the evaporating material are deposited as built-up layers which have sharp vertical edges or steps at the areas defined by the photoresist stencil. When the line of sight of the depositing material is from an oblique angle, the layer being deposited can have a negative slope which appears as an undercut edge. The present invention employs a lift-off overhang photoresist stencil in conjunction with a relatively high pressure of inert gas in the vacuum chamber so as to promote collision of the evaporated atoms and molecules with the inert gas. The colliding atoms and molecules of the evaporating material no longer appear to be originating from a point source but appear to originate from an extended area in the end of the vacuum chamber and deposit under the overhang photoresist stencil so as to provide symmetrical positive slope step changes at the edges of the material being deposited.

6 Claims, 7 Drawing Figures

U.S. Patent    Sep. 20, 1983    4,405,658
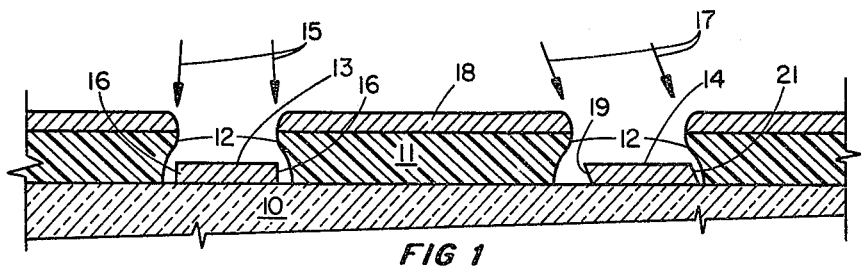
FIG 1
(PRIOR ART)
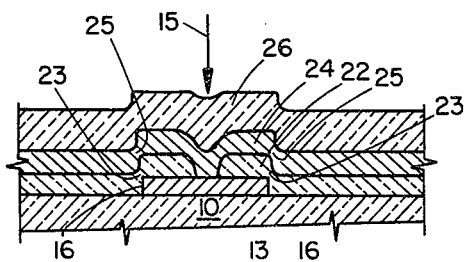
FIG 2
(PRIOR ART)
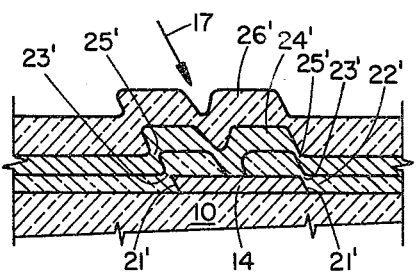
FIG 3
(PRIOR ART)
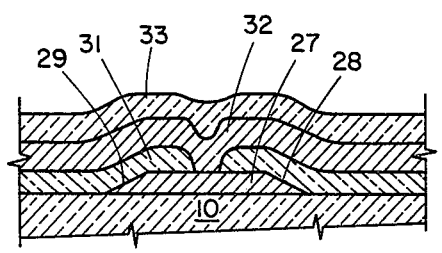
FIG 4
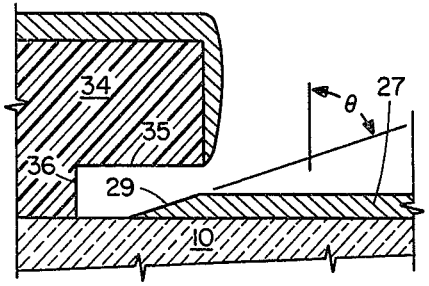
FIG 5
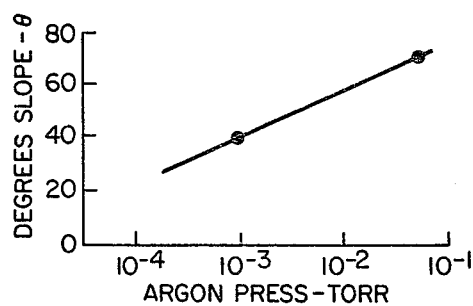
FIG 6
| PRESS TORR | M.F.P. CM | AVE. COLL. AT 35 CM |
|---|---|---|
| $10^{-6}$ | 5000 | <<1 |
| $10^{-4}$ | 50 | .7 |
| $10^{-3}$ | 5 | 7 |
| $10^{-2}$ | .5 | 70 |
| $3 \times 10^{-2}$ | .167 | 210 |
| $5 \times 10^{-2}$ | .1 | 350 |
FIG 7

METHOD OF PRODUCING POSITIVE SLOPE STEP CHANGES ON VACUUM DEPOSITED LAYERS

BACKGROUND OF THE INVENTION

1. Field of the Invention

This invention relates to a new method of making a positive slope at the step edge of layers being vacuum deposited to make Josephson junction devices or semiconductor devices. More particularly, the present invention provides a method of controlling the angle of positive slope step edge of vacuum deposited materials so that vertical steps and negative steps are eliminated and replaced by symmetrical gentle slope step changes.

2. Description of the Prior Art

Deposition of layers of metals and insulating materials by evaporation in a vacuum chamber are known techniques employed to make Josephson junction devices and semiconductor devices. Materials to be deposited are placed in a boat or a container and are heated until evaporation of the material occurs. In a high vacuum environment, the molecules and atoms of the vaporized material radiate outwardly from the container isotropically. The wafer or the substrate which is being processed is placed at a distance from the point source of the evaporating material. The atoms and molecules of the evaporated materials traverse the distance between the source container and the wafer in a straight line and are built up as a layer over the wafer as well as the surrounding equipment in the vacuum chamber.

When portions of a wafer are covered with a standard photoresist pattern, they restrict the deposition of the evaporated material to a predetermined area on the wafer. The photoresist pattern or stencil may form a vertical high step or vertical wall at the edge of the predetermined area or the wall may be tapered. Recent developments in making photoresist stencils have enabled the making of photoresist patterns which have tapered sides.

If a point source of evaporative material is directed on a straight line inside of the aperture formed by vertical walls of a photoresist pattern, the base area of the substrate may or may not be coated. When the point source of evaporating material strikes the top of the photoresist stencil on a line of sight which misses the vertical wall of the photoresist, the material will be deposited on one of the vertical walls and part of the material will be deposited so as to miss the other vertical wall of the photoresist pattern.

Photoresist patterns can be made which have a larger exposed area at the base on the wafer than at the top of the photoresist exposed to the evaporation of material. Thus, the photoresist pattern is undercut at the top surface and provides an offset ledge. Such photoresist stencils which have offset ledges are referred to as lift-off photoresist patterns. When evaporated material is deposited over such lift-off patterns, the top edge of the lift-off pattern defines an aperture window through which the evaporated material is projected along a straight line to be deposited on a projected area of the wafer exposed to the line of sight of the evaporated material. Thus, it is possible to generate on the same electrode or area being deposited a positive slope at one edge and a negative slope at the other edge.

When a small wafer is placed in a vacuum chamber at a substantial distance from the source of the evaporating material, the layer being deposited will have substantially vertical edge walls. If the wafer is large and/or the distance to the source of the evaporating material is small, there is a large angular deviation from the vertical or normal axis line of sight. When this deviation angle begins to exceed ten degrees, portions of the deposited material will have a positive slope at one edge and other portions at the opposite side of the wafer will have a negative slope.

Negative slope at the edge of deposited layers creates conditions which result in cracks in the insulation and voids at the undercut areas of the negative slope resulting in improper insulation and/or discontinuities between the subsequent layers deposited on top of the negative slope edge.

It has been proposed that large substrates and wafers may be mounted on articulating or rotary supports so that the portions of the wafer subject to the largest deviation angle is rotated closer to the normal axis during a portion of the deposition time. If any portion of the wafer encompasses the axis of rotation, there will still be angular deviation across the surface of the wafer. Rotating and evaporating at oblique angles tends to decrease the negative slope of deposited layers when small wafers are being processed, but it does not solve the negative slope problem when applied to large wafers.

When rotating and/or articulating wafers, the support means employed to provide this movement makes it extremely difficult, if not impossible, to cool the substrate to the very low temperatures that are often required in the manufacture of Josephson junction devices.

Accordingly, it would be desirable to deposit layers of metals or insulating materials by evaporation and deposition in a vacuum chamber in a manner which eliminates negative slope at the step edge of the deposited layers. Further, it would be desirable to provide a method of depositing layers of materials in a vacuum chamber which have symmetrical positive slopes without the requirement of moving the wafer.

SUMMARY OF THE INVENTION

It is a primary object of the present invention to produce positive slope step changes on vacuum deposited layers.

It is another primary object of the present invention to control the angle of positive slopes step change on vacuum deposited layers.

It is another primary object of the present invention to provide a method of producing gentle symmetrical positive slope step changes on vacuum deposited layers.

It is another object of the present invention to change the angle of positive slope step change on vacuum deposited layers during processing.

It is yet another object of the present invention to provide a process for eliminating negative slope step changes between layers of vacuum deposited materials without the requirement of moving fixtures.

According to these and other objects of the present invention, there is provided a vacuum chamber for the evaporation and deposition of materials from a point source. Before the material is evaporated to cause atoms and molecules to be isotropically dispersed from the point source, an inert gas is introduced into the vacuum chamber to increase the pressure and the density of the inert gas environment to a predetermined level. The controlled increase of inert gas in the vacuum chamber promotes collision of the evaporated atoms and molecules with the inert gas causing the apparent source of the evaporated material to appear extended across a broad area of the vacuum chamber rather than from a point source. A lift-off overhang photoresist stencil is applied over the layer to be coated and deposition occurs under the overhang of the lift-off photoresist stencil to provide a positive gentle slope step change instead of a vertical step or a negative slope step.

BRIEF DESCRIPTION OF THE DRAWINGS

FIG. 1 is an enlarged partial cross-section in elevation showing a portion of a wafer on which electrode material is being evaporated and deposited in a vacuum chamber employing prior art techniques;

FIG. 2 is an enlarged partial cross-section in elevation of one of the electrodes of FIG. 1 after a plurality of layers have been deposited thereon;

FIG. 3 is an enlarged partial cross-section in elevation of another of the electrodes of FIG. 1 after a plurality of layers have been deposited thereon;

FIG. 4 is an enlarged partial cross-section in elevation showing the novel positive slope step electrode after a plurality of layers have been deposited thereon;

FIG. 5 is an enlarged partial cross-section in elevation of the edge of the lift-off photoresist stencil adjacent to the novel positive slope step electrode of FIG. 4 after deposition of the electrode;

FIG. 6 is a graph showing the relationship between the degrees of positive slope obtained during the deposition of lead-indium-gold alloy in the presence of an argon inert gas; and FIG. 7 is a table showing the average number of collisions between the evaporated material and the argon inert gas at different argon gas pressures.

DESCRIPTION OF THE PREFERRED EMBODIMENT

Before describing the problem solved by the present invention, it is preferred to use the following definitions:

(1) For purposes of this invention, a step refers to the edge of a layer of a semiconductor or superconductive device and shall mean the vertical distance or height of the layer between the upper and lower surfaces of either an insulating layer or a metal layer.

(2) A positive slope occurs when the top surface of the layer being deposited is smaller than the base of the layer being deposited so that the slope or step edge is gradually inclined.

(3) A negative slope occurs when the top surface of the layer being deposited is larger than the base of the layer being deposited so that the slope or step edge is undercut.

FIG. 1 shows an enlarged partial cross-section in elevation of a portion of a wafer 10 on which a photoresist pattern or stencil 11 has been formed. The stencil 11 has lift-off pattern apertures 12 therein which define the open area in which material can be deposited to form the electrodes 13 and 14. The directional arrows 15 define the line of sight from the point source of a material being evaporated in a vacuum chamber (not shown). When the atoms and molecules are deposited in a high vacuum system, the line of sight 15 from the point source is isotropic. Thus, the atoms and molecules deposit on top of the photoresist pattern 11 as well as through the aperture 12 to form the electrode 13. When the line of sight is normal to the surface plane of the substrate or wafer 10, the sides of the electrode 13 are formed substantially vertical in alignment with the line of sight arrows 15. It will be noted that there is no undercut at the step edge 16 of the electrode 13.

Assuming that the electrode 14 is on a large wafer and presents a substantially large line of sight angle 17 from the point source (not shown). The material being evaporated and deposited will form on top of the photoresist 11 as material 18 as well as being deposited through the aperture 12 to form the electrode 14. It will be noted that the electrode 14 has a negative slope step 19 and a positive slope step 21.

Refer now to FIG. 2 showing the base electrode 13 on substrate 10 after the photoresist material 11 has been removed and after additional layers have been deposited on the substrate 10 and electrode 13 to form the layers associated with a Josephson junction device. The first layer 22 is an insulation layer formed by evaporation and deposition at a line of sight angle 15 substantially normal to the plane of the substrate 10. The insulation layer 22 is preferably a silicon oxide equal to or thicker than the base electrode 13. It will be noted that the material forms in such a manner that the thickness of the insulation layer 22 at the top of the step edge 16 is much thinner than the other portions of the insulation layer 22. This thin insulation critical area shown at point 23 creates a stress area which easily cracks and destroys the usefulness of the Josephson junction device. On top of insulation layer 23 there is shown a counter electrode 24 which is approximately equal to or thicker than the insulation layer 22. Since the layer 24 is also formed as a uniform layer, a step change occurs above slope 16 which is not as abrupt as the step change in the insulation layer 23 due to a smoothing effect during build-up. Thus, the critical area 25 between the insulation layer 22 and the counter electrode layer 24 is not as great as the stress area 23. It is possible but not desirable to increase the thickness of the counter electrode layer 24 to further increase the distance at the critical area 25. A passivation layer 26 is applied on top of the counter electrode layer 24 to provide insulation and protection to the Josephson junction device. Typically the passivation layer is much thicker than the insulation layer 23 and counter electrode layer 24, thus there is less possibility of creating a critical area over the step 16.

Refer now to FIG. 3 showing electrode 14 after the removal of the photoresist stencil 11, and the material 18 thereon, and after the deposition of the three layers which form the Josephson junction device. The silicon oxide layer 22' is formed in the same manner as described hereinbefore and the same critical areas 23' are produced which correspond to the critical areas 23 of FIG. 2. Due to the larger deviation of the angle from a normal axis shown as the line of sight 17, it is possible that the critical area 23' on the left side of the electrode 14 may be made even smaller than the critical area 23 shown in FIG. 2. When the counter electrode layer 24' is formed, the critical areas 25' are formed over the step areas 21'. The critical area 25' on the right side of the electrode 14 is smaller than the critical area 25' on the left side of electrode 14 due to the smoothing effect of the material being deposited. The passivation layer 26' is formed on top of the counter electrode 24' at a thickness which is sufficient to avoid stress areas that are more critical than those shown at areas 23' and 25'.

It will be understood that the schematic illustration in FIGS. 1 to 3 have not been drawn to exact scale but are representative of the approximate relative dimensions of the electrodes and layers being deposited so as to clearly illustrate the problem which arises when line of sight and point source deposition is employed in vacuum deposition processes. It is entirely possible that the undercut negative slope shown on the left side of electrode 14 will create a condition where the deposited material will not completely fill the space at the base of the negative slope 21' and a void in the insulation will occur at this point. Since Josephson junction devices are cycled between room temperature and approximately four degrees kelvin, the concentration of stresses at the thinning of the layers is sufficient to cause internal cracks and failure of the Josephson junction devices.

Refer now to FIG. 4 showing a base electrode 27 having symmetrical positive slopes 28 and 29. When the base electrode is made with gentle positive slopes, the subsequently deposited layers are deposited as substantially uniform replications of the contour of the base electrode 27, thus, there is no thinning and stress concentration area as described hereinbefore with reference to FIGS. 1 to 3 and the prior art. The insulation layer 31 is shown as being substantially uniform on top of the base electrode 27 and along the positive slopes 28, 29 as well as on top of the substrate 10. When the counter electrode 32 is formed on top of the insulation layer 31, there is a slight smoothing effect and the uniformity of the layer is even greater than with the insulation layer 31. Since the uniformity of the counter electrode layer 32 is already established, the passivation layer 33 may be made much thinner and stronger. It is well known that thick layers of passivation material 33 tends to promote stress concentrations whereas thin layers of passivation layer 33 are more immune to stresses due to thermal cycling.

Refer now to FIG. 5 showing an enlarged cross-section a portion of a photoresist stencil pattern 34 which has an overhang or ledge 35 which extends laterally from the gap height 36. The base electrode 27 is shown having a positive slope 29 formed under the ledge 35. The amount of positive slope at slope 29 is shown by the angle theta ($\theta$) from the vertical. It will be understood that if the angle was in the opposite direction and sloping backwards as an undercut ledge, the angle theta defining the slope angle would be a negative slope. The formation of the base electrode 27 shown in FIGS. 4 and 5 as well as the layers 31 to 33 are not formed from a point source (not shown) as will be explained hereinafter. In order to form the symmetrical slopes 28 and 29 as positive slopes, it will be necessary to provide sources of material which have lines of sight which are parallel to the slopes 28 and 29 at the same time.

Refer now to FIG. 6 showing a graph of the degrees of positive slope versus the inert gas pressure of argon. When a point source of material is provided in a vacuum chamber. The vacuum chamber is first pumped down to a high vacuum of at least $10^{-6}$ torr for most metal materials and $10^{-5}$ torr for aluminum. After the high vacuum necessary is achieved, it is possible to bleed in predetermined amounts of inert gas and raise the pressure within the vacuum chamber to a pressure of somewhere between $10^{-4}$ and $10^{-1}$ torr depending on the results desired. When the inert gas employed for the present novel process is argon, the FIG. 6 chart is applicable. When an angle theta shown in FIG. 5 as sixty degrees of positive slope is desired, an argon pressure of $10^{-2}$ torr is capable of producing this desirable positive slope. The chart shown in FIG. 6 was produced for deposition of lead-indium-gold base electrodes 27 and may differ slightly for other metal and may also differ slightly for other inert gases.

The explanation for the achievement of the desirable positive slope is that the point source has become an extended source which has no single point origin. The inert gas has caused the evaporated atoms and molecules to collide with the inert gas over the distance between the substrate or wafer 10 and the point source of material. The mean free path (MFP) which defines the average distance which an atom will travel before it collides with another atom is denoted by the symbol L in centimeters. It is well known that L is equal to $5 \times 10^{-3}$ divided by the argon pressure in torrs.

Refer now to FIG. 7 showing a table in which the mean free path L has been calculated in centimeters for a number of pressure conditions of argon gas. In the left hand column, the high vacuum pressure of $10^{-6}$ torr is substantially clean of contaminating gas and no argon gas is present. Under these conditions the average number of collisions over a distance of thirty-five centimeters is mush less than one. However, when the high vacuum pressure is replaced with an argon environment atmosphere of $10^{-4}$ torr, the mean free path is reduced to fifty centimeters and the average number of collisions over the distance between the material being evaporated and the substrate 10 is now approaching one. Once the argon pressure in the vacuum chamber is stabilized at $10^{-3}$ torr, the mean free path is decreased to five centimeters and approximately seven collisions occur between the atoms of the material being evaporated before reaching the substrate. It will be appreciated that seven collisions of atoms while traveling from the source of the material to the substrate 10 is sufficient to initiate a scatter or dispersion effect so that the point source is no longer a point source but appears as an extended source which extends throughout the vacuum chamber. As the pressure of the inert argon gas increases so does the positive slope angle theta.

Having explained how the presence of argon inert gas in a vacuum chamber will cause a point source of evaporating material to disperse and form at a positive angle under the ledge of a lift-off photoresist stencil, it will be appreciated that other materials than lead-indium-gold and other inert gases may be employed to accomplish the same results. For example, all of the layers explained with regards to FIG. 4 have been deposited in the presence of argon gas to achieve an operable Josephson junction device.

One of the important desirable results of achieving positive slope and gentle step changes is that much higher yields of acceptable devices are made without any added cost to the standard processes already commercially employed. A further advantage of the present novel process is that the vacuum chamber may be filled with wafers without the requirement that they be in axial or normal alignment with the point source of material being evaporated. Thus, not only are high yields achieved, but much higher production rates are achieved simultaneously with higher yields.

Having explained how the positive slope of layers of material being deposited in a vacuum chamber can be controlled by controlling the inert gas pressure during deposition, it will be appreciated that the amount of positive slope between layers can be changed during the process of depositing layers.

The present novel process has another advantage for manufacturers making custom devices. When custom devices are being manufactured, the vacuum chambers are usually relatively small compared to very large vacuum chambers used for high volume commercial production. Employing the present invention, large wafers up to six inches in diameter may be processed in a vacuum chamber where the distance from the source of evaporating material to the substrate is less than twelve inches and the sight angle would be greater than ten degrees from a point source. The amount of symmetrical positive slope achieved on the layers can then be controlled by the inert gas pressure.

While the line width of very small conductive lines is increased to some extent by the present invention, the advantages far outweigh the disadvantages in most cases. For example, when a conductive line on an integrated circuit is to be crossed by another conductive line on an integrated circuit, points of stress concentration at the vertical steps are completely eliminated by employing gentle positive slope step changes.

I claim:

1. A method of producing positive slope step changes between layers of material being deposited in a vacuum chamber on a wafer being processed, comprising:
   applying a lift-off photoresist overhang pattern to the layer of the wafer to be processed to define the overhang areas of said layer on which material shall be deposited,
   placing said wafer in a vacuum chamber,
   reducing the pressure in said vacuum chamber to a pressure sufficiently low to remove harmful traces of oxygen, water vapor and carbon monoxide,
   introducing an inert gas into said vacuum chamber to provide an inert gas environment therein,
   stabilizing said inert gas environment pressure at a high predetermined value of $1 \times 10^{-4}$ to $5 \times 10^{-2}$ torr,
   evaporating and depositing a layer of atoms of material over said lift-off pattern and onto said areas of said layer on which material shall be deposited,
   maintaining said inert gas environment pressure at said high predetermined value to cause the atoms of said material to be directly deposited and to disperse under said overhang of said photoresist areas and form positive slope step changes in excess of twenty degrees, and
   removing said lift-off photoresist overhang pattern leaving said deposited material with positive slope step changes at the edges.

2. A method of producing positive slope step changes as set forth in claim 1 wherein said material being evaporated and deposited is a lead alloy conductive metal.

3. A method of producing positive slope step changes as set forth in claim 2 wherein said conductive metal is a super-conductive metal.

4. A method of producing positive slope step changes as set forth in claim 1 wherein the step of stabilizing said inert gas pressure in said vacuum chamber includes increasing the pressure to more than $1 \times 10^{-2}$ torr.

5. A method of producing positive slope step changes as set forth in claim 2 wherein said step of reducing the pressure in said vacuum chamber includes reducing the pressure to less than $1 \times 10^{-5}$ torr, and
   wherein said layer of material being evaporated in aluminum.

6. A method of producing positive slope step changes as set forth in claim 1 wherein the step of introducing an inert gas into said vacuum chamber includes the step of introducing argon inert gas into said vacuum chamber, and
   stabilizing said argon inert gas environment pressure in a preferred range of $1 \times 10^{-4}$ to $1 \times 10^{-1}$ torr to produce positive slope step changes having slope angles in excess of twenty degrees.

* * * * *